United States Patent [19]

Diethelm

[11] 4,024,577
[45] May 17, 1977

[54] CONTROLLED POWER SUPPLY FOR A TELEVISION RECEIVER EQUIPPED WITH REMOTE CONTROL

[75] Inventor: Otto Diethelm, Adlum, Germany

[73] Assignee: Blaupunkt-Werke GmbH, Hildesheim, Germany

[22] Filed: Nov. 20, 1975

[21] Appl. No.: 633,805

[30] Foreign Application Priority Data

Dec. 10, 1974 Germany .......................... 2458302

[52] U.S. Cl. ................................. 358/190; 358/194
[51] Int. Cl.$^2$ ......................................... H04N 5/44
[58] Field of Search ............. 178/DIG. 15, DIG. 11, 178/7.3 R, 7.5 R; 325/390–392; 343/228; 358/194, 190

[56] References Cited

UNITED STATES PATENTS

| | | | |
|---|---|---|---|
| 3,052,848 | 9/1962 | Marks | 325/392 |
| 3,603,732 | 9/1971 | George | 178/DIG. 11 |
| 3,742,242 | 6/1973 | Morio et al. | 178/DIG. 11 |

*Primary Examiner*—John C. Martin
*Attorney, Agent, or Firm*—William R. Woodward

[57] ABSTRACT

A single isolation transformer supplies both the remote control receiver and the television receiver. A pulse generator such as a blocking oscillator which energizes the primary winding of the isolation transformer has its pulse width controlled in response to the loading of the circuit of the secondary winding of the isolation transformer, as measured by the voltage across a resistor in the circuit of a primary winding. This measuring resistor is interposed between the emitter of the switching transistor of the blocking oscillator and the receiver chassis. A transistor switching circuit for cutting off the low voltage supply to the scanning circuit oscillators of the television receiver is responsive to the output of the remote control receiver, to a signal from an operating control of the television receiver, and to an indication of overcurrent in the picture tube, independently.

9 Claims, 3 Drawing Figures

CONTROLLED POWER SUPPLY FOR A TELEVISION RECEIVER EQUIPPED WITH REMOTE CONTROL

The present invention relates to a power supply unit including a blocking oscillator for utilization with a television receiver provided with ultrasonic remote control, and more particularly to a television receiver the operating conditions of which are normal operation, a stand-by operation, and the turned-off condition, and a power supply unit therefor that includes an isolating transformer.

In recent times television receivers have frequently been provided with ultrasonic remote control devices for the purpose of offering easier control. As more and more television receivers are utilized in combination with additional equipment, it becomes increasingly necessary to connect the receivers only indirectly to the electric power mains (house wiring). In a known advantageous solution of this problem, a power supply unit includes an isolating transformer which is wired up with a blocking oscillator in the primary circuit. The blocking oscillator is supplied with a d-c voltage which is obtained by rectification of the supply voltage. Compared to the isolating transformers which are directly mains-operated, these so-called switch-mode power supply units have the advantage that they can be made in considerably smaller size, as they are operated at a significantly higher frequency, and the further advantage that they require less expensive means for rectification.

It is necessary to supply television receivers equipped with ultrasonic remote control with the possibility for a stand-by operation in which only the ultransonic receiver is supplied with power and, in some cases, also the heating current for the picture tube. Usually a separate power supply unit is provided for the ultrasonic receiver and the heating of the picture tube, a unit that includes an isolating transformer of its own, the primary winding of which is directly mains-fed. Upon transition from normal operation to stand-by operation, the power supply unit of the blocking osciallator is switched off, so that the television receiver receives only the relatively small quantity of energy required for the ultrasonic receiver and, in some cases, also for the heating of the picture tube.

Because of the required second isolating transformer, this known circuit has the disadvantages that it requires both greater space and greater expenditure.

It is the object of the present invention to develop a simplified power supply unit which does not have the above-mentioned disadvantages.

SUMMARY OF THE INVENTION

Briefly, the television receiver and the ultrasonic receiver are connected to the same isolating transformer; means for the switching from normal operation to stand-by operation and vice versa are placed in the secondary circuit of the isolating transformer, and means are arranged in the primary circuits of the isolating transformer for reducing the amount of energy made available for stand-by operation purposes.

The main advantages of the present invention are that no separate isolating transformer is required for supplying the current during the stand-by operation, and that, during the stand-by operation, it is nevertheless only the power required for this operation which is consumed.

An advantageous embodiment of the present invention obtains reduction of the energy quantum transmitted through the power supply during stand-by by reduction of the pulse width of the pulses generated by the blocking oscillator.

Another advantageous embodiment of the present invention utilizes measurement in the primary circuit of the isolating transformer of variation in load occurring in the secondary circuit as a control variable for determining the pulse width.

A further advantageous embodiment of the present invention obtains the control variable for the pulse width across a measuring resistor interposed in the connection of the emitter of the switching transistor of the blocking oscillator to the chassis.

Still another advantageous embodiment of the present invention provides that the voltage drop across the measuring resistor controls a controllable resistor.

The advantageous embodiments described above offer highly simple and advantageous possibilities for measuring the variation in load upon switching between normal and stand-by operation, as well as for the consequent control of the energy transmitted via the isolating transformer.

The possibility of a simple and inexpensive switching between normal and stand-by operation is achieved by effecting the switching between normal and stand-by operation by means of switching on or switching off, respectively, the low voltage supply of the line scan oscillator, and, especially, by a first switching transistor which short-circuits the base bias of a second switching transistor at the collector of which a direct current supply voltage is present and at the emitter of which a stabilized low voltage exists, when a positive signal is supplied from the operating control of the television receiver or from the remote control receiver to the base of the first switching transistor.

The circuit arrangements just mentioned offer the advantage that they may simultaneously be utilized as a protective circuit. This is achieved by a switching-off device for the low voltage which can also be triggered at any time by a signal built up by overcurrent in the picture tube.

BRIEF DESCRIPTION OF THE DRAWINGS

The invention is further described by way of illustrative example by reference to the annexed drawings in which.

DESCRIPTION OF THE PREFERRED EMBODIMENT

Figure 1:
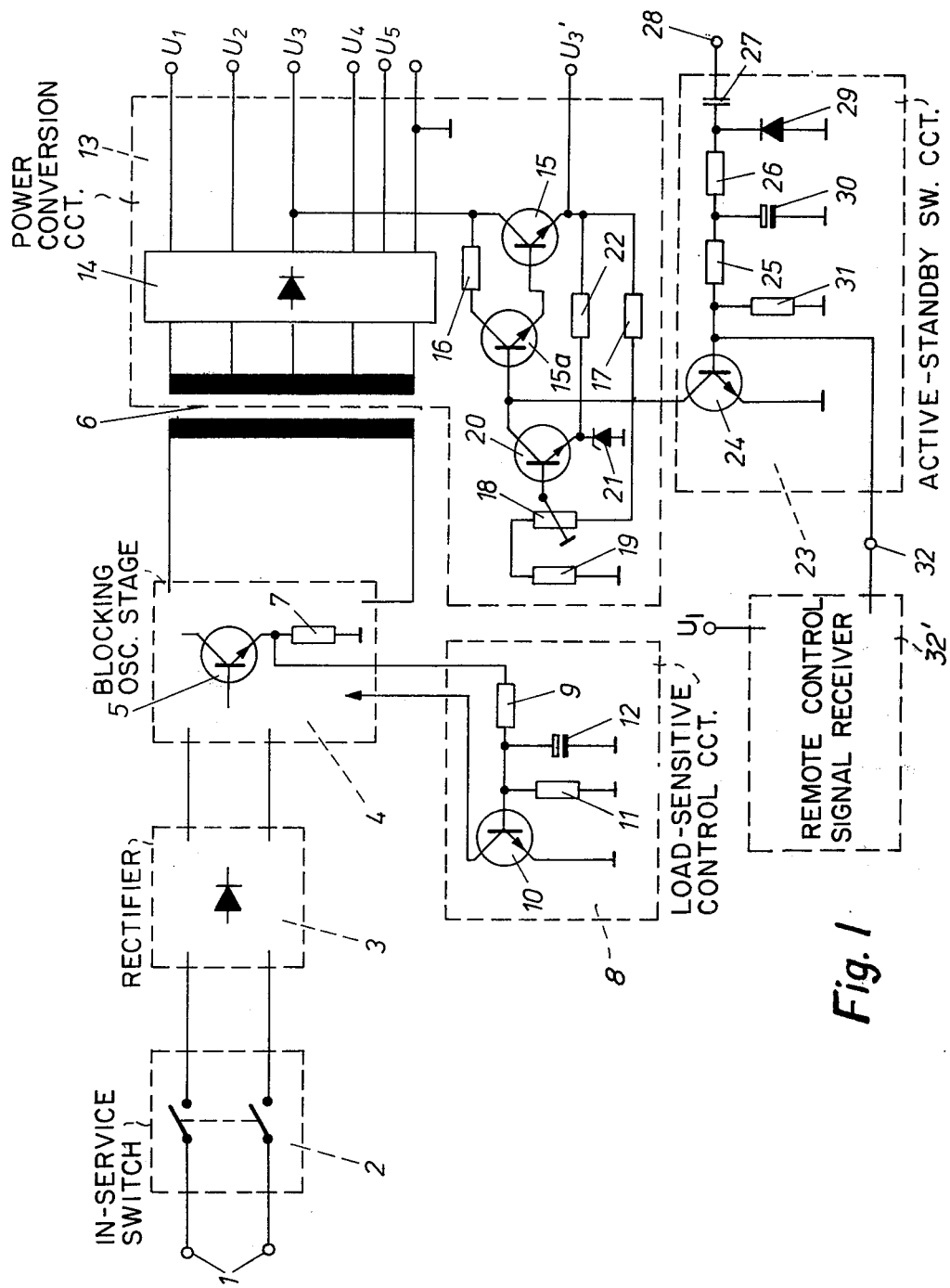
FIG. 1 is a circuit diagram, partly in block form, of an embodiment of the invention.

An on-off power switch 2 of the television receiver is connected to the supply terminals 1, providing a primary operating control for the receiver. Consequently, the supply voltage is also present at the output of the operating control 2 when the television receiver is turned on thereby, and arrives at a rectifying stage 3 comprising means for rectifying and smoothing the supply current as well as for suppressing interference. A d-c voltage, feeding a blocking oscillator stage 4, is present at the output of the recifying stage 3. The main part of the blocking oscillator 4, symbolically represented in FIG. 1 by a fragmentary circuit diagram, is a switching transistor 5, in the load circuit of which the primary winding of an isolating tranformer 6 is placed. A measuring resistor 7 is connected between the emitter of the switching transistor 5 and the chassis, across which measuring resistor a voltage is taken and applied to a load-dependent control circuit 8. The voltage taken at the measuring resistor 7 is fed via a resistor 9 to the base of a transistor 10 which serves as a controllable load for the blocking oscillator 4. A resistor 11 and a capacitor 12, each of which is connected to chassis with its other terminal, are also connected to the base of the transistor 10. The emitter of transistor 10 is connected to chassis, while the collector of the transistor 10 is connected back to the blocking oscillator stage 4.

In the secondary circuit of the isolating transformer 6, a d-c voltage supply stage or power conversion circuit 13 is placed, substantially consisting of a rectifying circuit 14, which, in the example shown, is provided with six outputs at which the voltages U 1 to U 5 can be taken off with respect to the sixth output connected to the chassis. At the terminal U 3, there is, in addition, a branch feeding both the collector-to-emitter path of the transistor 15 and also, through a resistor 16, the collector-to-emitter path of the transistor 15a. The emitter of the transistor 15a is directly connected to the base of transistor 15. The emitter of the transistor 15 is connected to chassis via a series connection of a resistor 17, a potentiometer 18, and a further resistor 19. The tap of the potentiometer 18 is connected to the base of a further transistor 20. The transistor 20 is connected to chassis by means of its emitter via a Zener diode 21, the collector of the transistor 20 controlling the base of the transistor 15a. The emitter of the transistor 20 is connected to the emitter of the transistor 15 via a resistor 22. A terminal for tapping off the voltage U 3' is connected to the emitter of the transistor 15.

The base of the transistor 15a is connected to a switching stage 23 responsive to a remote control ultrasonic receiver by a conductor leading to the collector of a switching transistor 24 which is connected to chassis via its emitter. The base of the switching transistor 24 is connected to an input terminal 28 leading into the television receiver via two resistors 25, 26 and a capacitor 27 connected in series, that input terminal 28 passing on switching signals from the receiver to the switching transistor 24, as will be explained in more detail below.

The cathode of a diode 29, which is connected to chassis via its anode, is connected to the junction point of the resistor 26 and the capacitor 27. The junction point of the two resistors 25, 26 is connected to chassis via a capacitor 30. The base of the switching transistor 24 is connected to chassis via a resistor 31. Furthermore, that base electrode is also connected to a terminal 32 to which an electrical switching signal is applied which is either built up in response to an ultrasonic signal received by the remote control receiver 32' or is supplied from an operating control of the television receiver. At the terminal 32, the switching transistor 24 receives the signal containing the information whether the television receiver is to work in the normal operating condition, i.e. to receive and process the sound and video signals, or in the stand-by condition in which it is substantially only the ultrasonic receiver that is supplied with current.

When a positive signal arrives at the base of the switching transistor 24, the latter becomes conductive, and causes chassis potential to be present at the base of transistor 15a. The transistor 15 is thereby blocked, and there is no longer any voltage at the terminal U 3'. Since the voltage U 3' serves as an operating voltage for the line and picture scan oscillator, the deflecting stages of the receiver cannot work and no high voltage and other related supply voltages are generated at the line circuit transformer. In consequence, by means illustrated diagrammatically in FIG. 2, the electric circuits connected to the terminals U 1 to U 3 are interrupted. The voltages U 4 and U 5 serve for supplying the ultrasonic receiver, i.e. they are required for the stand-by operation.

In case no counteracting means should be provided for, the variation in load would cause a voltage rise in the secondary circuit of the isolating transformer 6, which effect is, of course, not desired. Therefore, a measuring resistor is connected in the primary circuit in the emitter line of the switching transistor 5 of the blocking oscillator 6, the variation in load in the secondary circuit appearing at the measuring resistor 7 as a current variation. The current change thus produced, causes a variation in the base bias of the transistor 10, the capacitor 12 having an integrating effect to avoid undesired effects due to interference pulses and abrupt load fluctuations.

Figure 3:
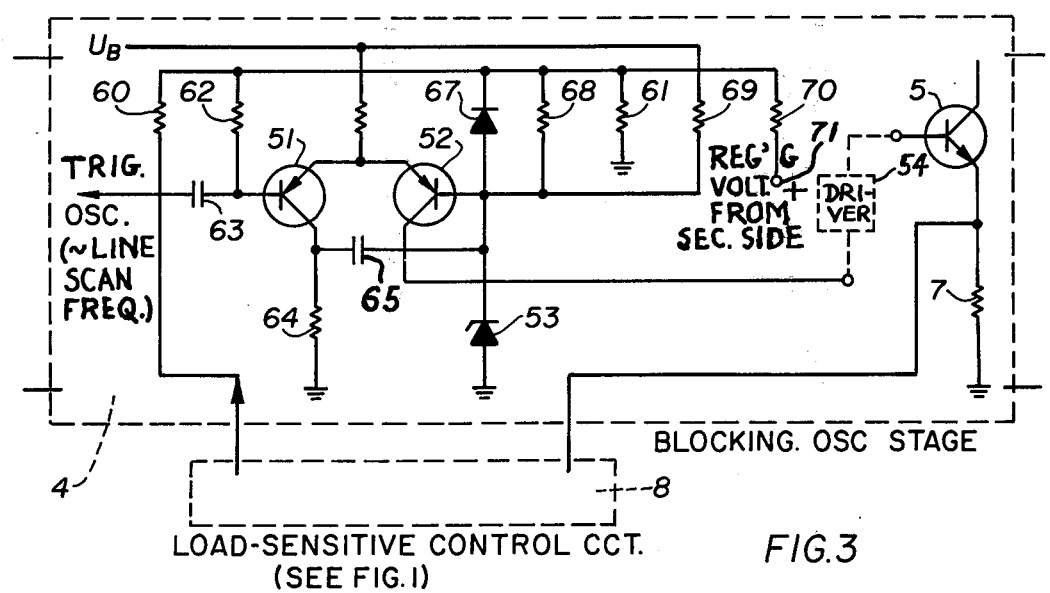
FIG. 3 is a circuit diagram of one way of controlling the pulse width of the blocking oscillator 4 in response to the switching circuit 8 in the circuit of FIG. 1.

The change of the working point of the transistor 10 causes a change in the pulse width in the blocking oscillator stage 4, as more fully shown in FIG. 3, so that the energy quantum transmitted via the isolating transformer 6 is such that the required voltages are present in the secondary circuit. It should also be mentioned that the load-dependent switch 8 and the circuit of FIG. 3 are represented only by way of illustration and that many circuit arrangements may be devised by straightforward application of known principles for controlling the pulse width.

The circuit connected between the terminal 28 and the base of the switching transistor 24 serves as a part of a protective circuit for the picture tube. Any overcurrent is measured at the low-end resistor 31 of the high-voltage cascade in conventional techinque. The voltage thus produced is fed to the base of the switching transistor 24, and causes the television receiver to be switched over to stand-by operation, so that no damage can be done to the picture tube. Thus, the device performing the switching between normal operation and stand-by operation is advantageously and simultaneously utilized as a protective circuit. The circuit 23, as shown, provides for stabilizing the potential at the base of transistor 24 and for integrating such possibly occurring overload peaks as are not intended to triggering the protective circuit.

Using the circuit diagram according to FIG. 3 it is possible in a simple manner to control the pulse width of the blocking oscillator 4 in response to the switching circuit 8.

Figure 2:
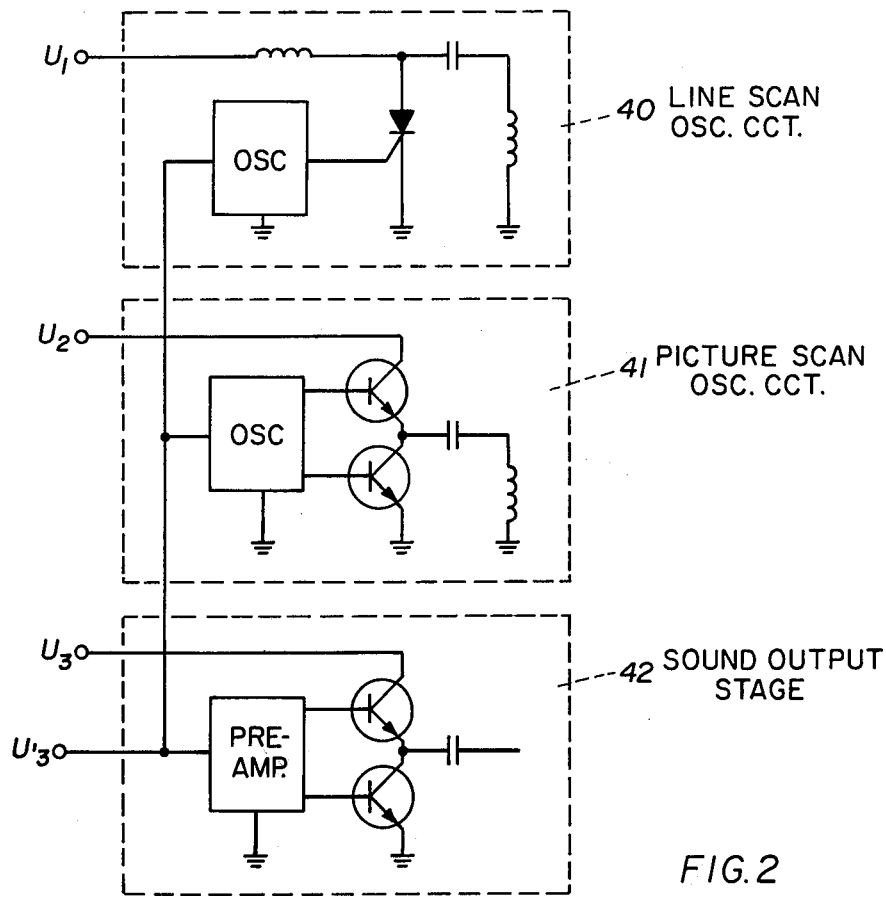
FIG. 2 is a circuit diagram of one form of means for interrupting the power to the picture circuits in the stand-by condition in connection with the circuit of FIG. 1.

According to the circuit diagram of FIG. 2 the terminal U1 is connected to a line scan oscillator circuit 40, the terminal U2 to a picture scan oscillator circuit 41 and the terminal U3 to a circuit 42 for a sound output stage. The circuits 40, 41, 42 get their operating voltage from the terminal U3'. If the operating voltage U3' is zero, the circuits 40, 41, 42 are interrupted. In this case the voltages at the terminals U1, U2, U3 remain.

The described circuit of this invention for controlling the voltage in the secondary circuit of the isolating transformer 6 offers the advantage that it is exclusively arranged in the primary circuit, and, therefore, permits an uncomplicated design which is easy to realize. To control the pulse width by measuring the load fluctuations at the low-end resistor of the switching transistor 5, represents a very useful means for control since, thereby the transmitted energy can effectively and easily be controlled.

The blocking oscillator stage 4 shown in detail in FIG. 3 incorporates an externally triggered blocking oscillator arranged to be triggered through an oscillator operating preferably at the line scanning frequency, which is to say its wave form is not particularly critical and it should be provided with means to keep it in step with the line scanning frequency, as is known to be desirable. The transistors 51 and 52 of the triggered output stage of the blocking oscillator circuit could be regarded as constituting a differential amplifier the inputs of which are defined by the base connections of the respective transistors 51 and 52. The input voltage is applied to the base connection of transistor 52 is the Zener voltage of the Zener diode 53, thus a constant reference voltage. The operating voltage for the transistors 51 and 52 and for the Zener diode 53 is obtained from the supply voltage $U_B$, which is to say from the rectifier 3. The diode 67 protects the transistor 52, for example at the time of the apparatus being switched on, against damage from an excessively high emitter-base blocking voltage. The capacitor 65 prevents undesired oscillation of the circuit of transistors 51 and 52, which could give rise to undesired disturbances.

At the base of the transistor 51, there is present as input voltage for the circuit a composite voltage that is the sum of three voltages. These are, first, the line scan frequency trigger voltage coupled through the capacitor 63; second, a bias voltage dependent upon the loading of the blocking oscillator stage resulting from the load on the secondary of the transformer 6, but detected by the voltage across the resistor 7 and actually controlled by the load-sensitive control circuit 8, and, third, a regulating voltage applied at the terminal 71 of the resistor 70, which regulating voltage is proportional to the voltage of the secondary winding of the transformer 6 and can accordingly be provided by one or another of the output circuits of the rectifier 14 of FIG. 1 or by a separate winding of the transformer 6 and a separate rectifier element connected in circuit therewith. This regulating voltage and the control voltage provided by the control circuit 8 are applied to the resistor 61 which completes the circuit for both of these bias voltages and their combined effect constitutes the bias voltage for the transistor 51 which determines its working point.

The circuit of the transistors 51 and 52 operates as an overdriven differential amplifier. When the trigger voltage exceeds the threshold determined by the base voltage of the transistor 51, the circuit produces an approximately rectangular output voltage pulse of constant amplitude. Since the trigger voltage is recurrent, the result is a periodic succession of rectangular output voltage pulses, but the duration or pulse width of these pulses depends upon the loading and the output voltage of the stage. The output voltage of the circuit constituted by the transistors 51 and 52 comes from the emitter connection of the transistor 52 and is furnished to the switching transistor 5, preferably through a driver stage 54, such as a transformer or another transistor stage for better matching of the circuit impedances. Of course, the collector circuit of the transistor 5 includes the primary winding of the transformer 6 of FIG. 1.

The described power supply unit thus represents a well functioning component subject to but a small number of potential sources of error, due to the simple design, and permits considerable reduction of costs in comparison with circuits and equipment heretofore known.

I claim:

1. A power supply circuit for a television receiver equipped for remote control comprising, in combination:

an on-off switch for connecting and disconnecting the television receiver and its power supply circuit respectively to and from the electricity supply mains;

pulse generating means arranged for energization through said on-off switch;

an isolation transformer having its primary winding supplied with the output of said pulse generating means;

a power conversion circuit connected to the secondary winding of said isolation transformer for energization thereby, for supplying an operating voltage for the scanning circuits of the television receiver and for supplying a plurality of other voltages to said receiver, at least one of which other voltages is also supplied to said scanning circuits;

a remote control signal receiver for remote control of said television receiver and controlled switching means responsive to said remote control receiver for switching said television receiver between a stand-by condition and an operating condition, both said remote control receiver and said controlled switching means being connected to a secondary winding of said isolation transformer for energization thereby, said controlled switching means having a switching path for connecting and disconnecting said scanning circuits of said television receiver respectively to and from a source of said operating voltage in said power conversion circuit and means for reducing energy transfer through said pulse generating means to said isolation transformer when said television receiver is in the stand-by condition.

2. A power supply circuit as defined in claim 1, in which said pulse generating means includes rectifying means energized through said on-off switch for supplying direct current for energization of said pulse generating means.

3. A power supply circuit as defined in claim 2, in which said energy transfer reducing means includes means for varying the width (duration) of pulses generated by said pulse generating means in response to the extent of loading of the secondary circuit of said isolating transformer as measured in the primary circuit of said transformer.

4. A power supply circuit as defined in claim 2, in which said pulse generating means includes a blocking oscillator and said energy transfer reducing means includes means for reducing the width (duration) of the pulses generated by said blocking oscillator.

5. A power supply circuit as defined in claim 4, in which said blocking oscillator includes a switching transistor (5) and a load measuring resistor (7) interposed in a connection between the emitter of said switching transistor and the receiver chassis, and in which said pulse width reducing means is responsive to the voltage drop across said load measuring resistor.

6. A power supply circuit as defined in claim 5, in which said pulse width reducing means includes a controllable resistance (10) in the circuit of said blocking oscillator controlled in response to the voltage drop across said load measuring resistor.

7. A power supply circuit as defined in claim 1, in which said operating voltage connected and disconnected to said scanning circuits by said controlled switching means is the low voltage supply voltage (U 3') of the line scan and picture scan oscillators of the television receiver and in which said controlled switching means is controlled so as to switch off said low voltage supply voltage to put the television receiver in the stand-by condition.

8. A power supply circuit as defined in claim 7, in which said controlled switching means includes a first switching transistor (15) at the collector of which there is applied a direct current supply voltage (U 3) energized through said isolating transformer and a second switching transistor (24) for controllably short-circuiting the base bias of said first switching transistor, whereby a stabilized low voltage (U 3') exists at the emitter of said first switching transistor (15) when a positive signal is supplied from an operating control of the television receiver or from said remote control receiver to the base of said second switching transistor (24).

9. A power supply circuit as defined in claim 7, in which said controlled switching means is responsive independently to an overcurrent condition in the picture tube for switching off said low voltage supply voltage (U 3') in response to said overcurrent condition.

* * * * *